US012110933B2

(12) United States Patent
Filip et al.

(10) Patent No.: US 12,110,933 B2
(45) Date of Patent: *Oct. 8, 2024

(54) WEAR RESISTANT BRAKING SYSTEMS (71) Applicant: Tech M3, Inc., Poway, CA (US)

(72) Inventors: Peter Filip, Poway, CA (US); Nathan K. Meckel, Ramona, CA (US)

(73) Assignee: Tech M3, Inc., Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/122,822

(22) Filed: Mar. 17, 2023

(65) Prior Publication Data
US 2023/0220894 A1 Jul. 13, 2023

Related U.S. Application Data (63) Continuation of application No. 17/123,470, filed on Dec. 16, 2020, now Pat. No. 11,624,416, which is a
(Continued)

(51) Int. Cl.
F16D 65/12 (2006.01)
C23C 14/34 (2006.01)
(Continued)

(52) U.S. Cl.
CPC .......... F16D 65/127 (2013.01); C23C 14/34 (2013.01); C23C 28/32 (2013.01); C23C 28/347 (2013.01);
(Continued)

(58) Field of Classification Search
CPC ...... F16D 65/127; F16D 65/125; F16D 65/12; F16D 2065/132; F16D 2069/004;
(Continued)

(56) References Cited

U.S. PATENT DOCUMENTS 2,753,808 A 7/1956 Kluge
3,171,527 A 3/1965 Josef
(Continued)

FOREIGN PATENT DOCUMENTS

DE 538507 C 11/1931
DE 102004016092 A1 10/2005
(Continued)

OTHER PUBLICATIONS

Yu, et al. "Vapor deposition of platinum alloyed nickel aluminide coatings." Surface & Coatings Technology 201, (Jun. 2006) pp. 2326-2334.
(Continued)

Primary Examiner — Pamela Rodriguez
(74) Attorney, Agent, or Firm — The Dobrusin Law Firm, PC (57) ABSTRACT In some implementations of the current subject matter, a brake rotor can include a supporting layer applied to a friction surface of a brake rotor substrate, which can optionally include cast iron, and a coating applied over the supporting layer. The supporting layer can include a preparatory metal, and the coating can impart wear and corrosion resistant properties to the friction surface. Related systems, methods, articles of manufacture, and the like are disclosed.

19 Claims, 6 Drawing Sheets

Related U.S. Application Data continuation of application No. 16/225,486, filed on Dec. 19, 2018, now Pat. No. 10,895,295, which is a continuation of application No. 14/359,293, filed as application No. PCT/US2014/029950 on Mar. 15, 2014, now Pat. No. 10,197,121.

(60) Provisional application No. 61/802,064, filed on Mar. 15, 2013, provisional application No. 61/802,051, filed on Mar. 15, 2013.

(51) Int. Cl.
*C23C 28/00* (2006.01)
*F16D 65/02* (2006.01)
*F16D 69/00* (2006.01)

(52) U.S. Cl.
CPC ........ *F16D 65/12* (2013.01); *F16D 2065/132* (2013.01); *F16D 2069/004* (2013.01); *F16D 2200/0026* (2013.01); *F16D 2200/003* (2013.01); *F16D 2250/00* (2013.01); *F16D 2250/0046* (2013.01)

(58) Field of Classification Search
CPC ....... F16D 2200/0026; F16D 2200/003; F16D 2250/00; F16D 2250/0046; C25D 13/14; C25D 7/00; C23C 14/34; C23C 28/32; C23C 28/347
See application file for complete search history.

(56) References Cited

U.S. PATENT DOCUMENTS

| | | |
|---|---|---|
| 3,314,509 A | 4/1967 | Pelikan |
| 3,403,759 A | 10/1968 | Holcomb |
| 3,443,454 A | 5/1969 | Hall |
| 3,613,851 A | 10/1971 | Ely |
| 3,708,042 A | 1/1973 | Krause |
| 3,899,054 A | 8/1975 | Huntress |
| 3,907,076 A | 9/1975 | Crossman |
| 3,993,415 A | 11/1976 | Hauser |
| 4,180,622 A | 12/1979 | Burkhard |
| 4,290,510 A | 9/1981 | Warren |
| 4,350,231 A | 9/1982 | Crossman |
| 4,555,239 A | 11/1985 | Miranti, Jr. |
| 4,565,274 A | 1/1986 | Cameron |
| 4,613,021 A | 9/1986 | Lacombe |
| 4,808,275 A | 2/1989 | Ohzora |
| 4,837,250 A | 6/1989 | Headrick |
| 4,848,553 A | 7/1989 | Cameron |
| 4,860,872 A | 8/1989 | Flotow |
| 4,869,356 A | 9/1989 | Cameron |
| 4,933,300 A | 6/1990 | Koinuma et al. |
| 5,116,691 A | 5/1992 | Darolia |
| 5,158,165 A | 10/1992 | Flotow |
| 5,306,407 A | 4/1994 | Hauzer |
| 5,407,035 A | 4/1995 | Cole et al. |
| 5,482,742 A | 1/1996 | Takamiya |
| 5,501,306 A | 3/1996 | Martino |
| 5,535,857 A | 7/1996 | Barlow |
| 5,558,186 A | 9/1996 | Hyde |
| 5,612,110 A | 3/1997 | Watremez |
| 5,709,288 A | 1/1998 | Riebe |
| 5,725,913 A | 3/1998 | Wong et al. |
| 5,769,185 A | 6/1998 | Main |
| 5,838,522 A | 11/1998 | Komvopoulos et al. |
| 5,861,203 A | 1/1999 | Yuan et al. |
| 5,884,388 A | 3/1999 | Patrick et al. |
| 5,901,818 A | 5/1999 | Martino |
| 5,922,452 A | 7/1999 | Takahashi |
| 5,928,771 A | 7/1999 | DeWald, Jr. |
| 6,119,828 A | 9/2000 | Parsons |
| 6,155,397 A | 12/2000 | Killian |
| 6,196,936 B1 | 3/2001 | Meckel |
| 6,302,246 B1 | 10/2001 | Naumann |
| 6,457,566 B1 | 10/2002 | Toby |
| 6,514,592 B1 | 2/2003 | Hubbard |
| 6,527,092 B2 | 3/2003 | Gruber et al. |
| 6,536,564 B1 | 3/2003 | Garfinkel |
| 6,585,089 B1 | 7/2003 | Parker |
| 6,612,415 B2 | 9/2003 | Yamane |
| 6,797,388 B1 | 9/2004 | Szanyi |
| 6,857,509 B1 | 2/2005 | Braiato |
| 6,935,470 B1 | 8/2005 | Smith, Jr. |
| 7,097,922 B2 | 8/2006 | Shen et al. |
| 7,246,586 B2 | 7/2007 | Hosenfeldt |
| 7,246,859 B2 | 7/2007 | Hosenfeldt |
| 7,261,192 B2 | 8/2007 | Khambekar |
| 7,513,342 B2 | 4/2009 | Waninger |
| 7,799,420 B2 | 9/2010 | Beck |
| 8,084,089 B2 | 12/2011 | Meckel |
| 8,408,369 B2 | 4/2013 | Woychowski |
| 8,449,943 B2 | 5/2013 | Meckel |
| 8,893,863 B2 | 11/2014 | Meckel |
| 9,255,618 B2 | 2/2016 | Beer et al. |
| 9,394,955 B2 | 7/2016 | Huschenhoefer |
| 9,581,211 B2 | 2/2017 | Holly |
| 9,618,066 B2 | 4/2017 | Schoepf |
| 9,638,276 B2 | 5/2017 | Schluck |
| 9,653,978 B2 | 5/2017 | Zernikow |
| 10,197,121 B2 | 2/2019 | Filip |
| 10,895,295 B2 | 1/2021 | Filip |
| 11,624,416 B2 * | 4/2023 | Filip ................. F16D 65/127 204/192.12 |
| 2002/0117360 A1 | 8/2002 | Toby |
| 2002/0153213 A1 | 10/2002 | Gruber |
| 2002/0179382 A1 | 12/2002 | Fryska |
| 2003/0136614 A1 | 7/2003 | Feldmann |
| 2003/0145447 A1 | 8/2003 | Moseley |
| 2003/0183306 A1 | 10/2003 | Hehmann |
| 2004/0129314 A1 | 7/2004 | Welty |
| 2004/0178029 A1 | 9/2004 | Hoyte |
| 2005/0056495 A1 | 3/2005 | Greppi |
| 2005/0087406 A1 | 4/2005 | Meckel |
| 2005/0183909 A1 | 8/2005 | Rau et al. |
| 2005/0252739 A1 | 11/2005 | Callahan |
| 2006/0079749 A1 | 4/2006 | Grau |
| 2006/0175160 A1 | 8/2006 | Weiss |
| 2006/0272909 A1 | 12/2006 | Fuller |
| 2007/0234929 A1 | 10/2007 | Reinsch et al. |
| 2007/0286961 A1 | 12/2007 | Pahle |
| 2008/0041675 A1 | 2/2008 | Baumgartner |
| 2008/0196985 A1 | 8/2008 | Meckel |
| 2008/0196986 A1 | 8/2008 | Meckel |
| 2008/0213610 A1 | 9/2008 | Idei et al. |
| 2009/0026025 A1 | 1/2009 | Hampton |
| 2009/0026026 A1 | 1/2009 | Martino |
| 2009/0050423 A1 | 2/2009 | Meckel |
| 2009/0288921 A1 | 11/2009 | Meckel |
| 2011/0048871 A1 | 3/2011 | Meckel |
| 2011/0056777 A1 | 3/2011 | Woychowski |
| 2011/0133132 A1 | 6/2011 | Zhamu |
| 2011/0135948 A1 | 6/2011 | Pyzik |
| 2012/0037465 A1 | 2/2012 | Abe |
| 2012/0118686 A1 | 5/2012 | Meckel |
| 2013/0008748 A1 | 1/2013 | Lembach |
| 2013/0112514 A1 | 5/2013 | Hanna |
| 2013/0161136 A1 | 6/2013 | Huschenhoefer |
| 2013/0161137 A1 | 6/2013 | Huschenhoefer |
| 2013/0220745 A1 | 8/2013 | Meckel |
| 2014/0332330 A1 | 11/2014 | Orr |
| 2015/0041262 A1 | 2/2015 | Meckel |
| 2015/0369314 A1 | 12/2015 | Filip |
| 2015/0369315 A1 | 12/2015 | Wall |
| 2017/0184164 A1 | 6/2017 | Bean |
| 2019/0063525 A1 | 2/2019 | Wall |

FOREIGN PATENT DOCUMENTS

| | | |
|---|---|---|
| DE | 102011122308 A1 | 6/2012 |
| EP | 1256739 A2 | 11/2002 |
| EP | 1258647 B1 | 2/2012 |
| EP | 2707621 B1 | 7/2016 |

(56) References Cited

FOREIGN PATENT DOCUMENTS

| FR | 788671 | A | 10/1935 |
|---|---|---|---|
| FR | 2807484 | A1 | 10/2001 |
| GB | 2154614 | A | 9/1985 |
| JP | 63026210 | A | 2/1988 |
| JP | 02175859 | A | 7/1990 |
| JP | 04312220 | A | 11/1992 |
| JP | 04337126 | A | 11/1992 |
| JP | 04337127 | A | 11/1992 |
| JP | 07208520 | A | 8/1995 |
| JP | 07224390 | A | 8/1995 |
| JP | 09118755 | A | 5/1997 |
| JP | 2003049252 | A | 2/2003 |
| JP | 2004316850 | A | 11/2004 |
| KR | 101998049479 | A | 9/1998 |
| KR | 1019990036405 | | 5/1999 |
| KR | 1020060051087 | A | 5/2006 |
| KR | 2010/0098817 | A | 9/2010 |
| WO | 9738235 | A1 | 10/1997 |
| WO | 9850837 | A1 | 11/1998 |
| WO | 2006092270 | A1 | 9/2006 |

OTHER PUBLICATIONS

Terry Tritt, "Thermal Conductivity: Theory, Properties, and Applications." (2004):100.

* cited by examiner

WEAR RESISTANT BRAKING SYSTEMS

CROSS-REFERENCE TO RELATED APPLICATIONS

This application claims priority to U.S. Provisional Application No. 61/802,051 and U.S. Provisional Application No. 61/802,064, both of which were filed on Mar. 15, 2013. The disclosure of each application is incorporated by reference herein.

TECHNICAL FIELD

The subject matter described herein relates to braking systems, for example to brake rotors and brake pads for use as part of braking systems for slowing or stopping a vehicle.

BACKGROUND

A vehicle braking system for use on a wheeled vehicle generally includes a rotating device that rotates with a wheel while the vehicle is in motion and a second device that is mounted to an apparatus on the vehicle body itself and that does not rotate with the wheel while the vehicle is in motion. When the brakes are applied, the apparatus moves the second device into contact with a surface or surfaces on the rotating device to create friction between the rotating device and the friction device. The resulting friction causes the speed of the vehicle to decrease. In a vehicle with a disk braking system, the rotating device is commonly referred to as a brake disk or a brake rotor while the second device is commonly referred to as a brake pad. In a vehicle with drum brakes, the rotating device is commonly referred to as a drum while the second device is commonly referred to as a brake shoe. The terms "brake rotor" and "brake pad" are used throughout this disclosure to refer generically and respectively to a rotating device of a braking system and a second device of a braking system.

A braking system can include one or more components operable to move a friction material or other surface on the brake pad to forcibly contact with a friction surface of the brake rotor. The braking system can be controlled by a user operable mechanism, such as a foot-operated brake pedal or a hand-operated grip device and can be mechanical, electrical, hydraulic, or the like. For braking systems featuring a brake rotor, the mechanism can be a set of calipers and a mechanical, electrical, hydraulic, etc. system for applying pressure to one or more brake pads mounted to each caliper to urge it/them against the friction surfaces of the brake rotor. The brake rotor typically has two opposing friction surfaces on opposite annular faces of a disk-like structure, which can optionally include vanes or other internal structures for providing ventilation, reducing weight, or otherwise supporting some amount of non-solid volume disposed between the two opposing friction surfaces, etc. In brake drum systems, the friction surface of the drum is typically on the inner rotation surface. The brake shoes are urged against the friction surface by calipers, levers, pistons, or other devices that are controlled by the user.

Brake rotors are generally made of a durable material while brake pads are made of a material that wears away under the friction resulting from stopping or slowing a vehicle. However, brake rotors typically also experience wear and eventually require replacement or re-machining, which can be expensive. Additionally, particulate debris from brake pads generated during braking are typically released to the environment. Because of the chemical compositions typically employed in brake pads, this particulate debris can include constituents, including but not limited to copper, cadmium, lead, mercury, and the like, that are known or suspected to have harmful effects when found in significant quantities in the environment. In addition, the heat generated during the braking process can promote reactions between chemical components of the brake pad, which can cause the formation of toxic materials and/or gases.

Currently available brake rotors are most frequently manufactured out of cast iron for a number of reasons. For example, one or more physical properties of cast iron, such as for example the ability to handle large amounts of heat generated during braking and the relative ease with which it can be cast and formed into a necessary shape, can be desirable. In addition, cast iron is generally quite inexpensive as a bulk material (in particular in comparison to other materials such as stainless steel, titanium, carbon fiber, and the like that are used in some braking applications). Production processes for cast iron brake rotors are also relatively established and well-known. Furthermore cast iron is generally accepted as a standard brake rotor material.

However, cast iron is relatively soft. It works well as a brake rotor due to its interactions with a brake pad, which can generate significant friction. Cast iron tends to wear due to this friction interaction, and as it does so it introduces particulate matter to the environment. Particulate materials are strongly suspected of causing health issues and other environmental problems. Furthermore, rotor wear requires regular and costly maintenance of a braking system of a vehicle, typically including re-machining or even replacing the brake rotors on a regular basis.

SUMMARY

In one aspect, a brake rotor includes a supporting layer applied to a friction surface of a brake rotor substrate and one or more coatings applied over the supporting layer. The supporting layer includes a preparatory metal and the coating(s) imparts wear and corrosion resistant properties to the friction surface.

In an interrelated aspect, a method includes applying a supporting layer to a friction surface of a brake rotor substrate and applying a coating applied over the supporting layer. The supporting layer includes a preparatory metal, and the coating imparts wear and corrosion resistant properties to the friction surface.

In another interrelated aspect, a method includes transferring an amount of a friction material from a brake pad to a friction surface of a brake rotor having persistent surface roughness features. The transferring creating a transfer film layer on the friction surface, and that transfer film layer is retained on the friction surface at least in part due to the persistent surface roughness features. The method further includes stopping a vehicle by actuating a braking system that includes the brake pad and the brake rotor. The actuating causes the friction material of the brake pad to be urged into contact with the transfer film layer on the friction surface of the brake rotor such that an adherent friction interaction between the friction material and the transfer film layer enhances a braking power of the braking system.

In some variations of these aspects, one or more of the following features can optionally be included in any feasible combination. The brake rotor substrate can include at least one of cast iron and an alloy of cast iron, among other possible materials, which are advantageously low cost and have acceptable structural strength and/or heat transfer properties. The friction surface of the brake rotor substrate can include an activated layer or surface that result from back-sputtering of the friction surface prior to the supporting layer having been applied. The back-sputtering of the friction surface can include accelerating ions of the preparatory metal at the friction surface under a voltage in a range of approximately 400 V to 1200 V. The preparatory metal can include chrome or other metals.

In some variations one or more of the following features can optionally be included in any feasible combination. The coating can include graphene. The coating can alternatively or in addition include a first layer comprising a first material and a second layer comprising a second material. The first material can include a metal. The metal can include at least one of titanium, chromium, zirconium, aluminum, and hafnium. The first layer can include a plurality of layers of the first material merged to form a single layer. The second material can include at least one of a nitride, a boride, a carbide, or an oxide of the first material. The coating can include multiple iterations of the first layer and/or the second layer. These multiple iterations of the first and/or second layer can be either homogenous layers or inhomogeneous layers. Use of multiple layers as described herein can improve the structural integrity of the overall coating structure and allow it to resist greater mechanical forces common to a braking event. The multiple iterations of the first layer can be deposited sequentially prior to deposition of the multiple iterations of the second layer, or the multiple iterations of the first layer can be deposited alternatively with intervening deposition of one or more of the multiple iterations of the second layer. Each of the multiple iterations of the first layer and each of the multiple iterations of the second layer can have a thickness in a range of one atom to three or four thousand Angstroms. The friction surface of the brake rotor can include a first scale of surface topography that can include a plurality of island formations separated by channels. The friction surface of the brake rotor can include a second scale of surface topography that can include a plurality peaks and valleys of regular or irregular shape.

Some of a friction material of a brake pad can be transferred to the friction surface of the brake rotor during braking such that a transfer film layer including the transferred friction material is created and mechanically held in place on the friction surface of the brake rotor by persistent surface roughness features of the first and/or second scale of surface topography. The friction material of the brake pad and the friction material of the transfer film layer can participate in an adherent friction interaction that enhances a first braking power of the first combination of braking components relative to a second braking power of the second combination of braking components. A friction material of the first brake pad can consist essentially of components other than copper. A friction material of the first brake pad can include an environmentally beneficial component.

The details of one or more variations of the subject matter described herein are set forth in the accompanying drawings and the description below. Other features and advantages of the subject matter described herein will be apparent from the description and drawings, and from the claims. This summary is not intended to be limiting. Rather the claims that eventually issue in this application are to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements. It will be understood that any dimensions (either absolute or relative to other features) shown in the drawings may or may not be representative of actual absolute or relative dimensions occurring in one or more implementations of the current subject matter.

DETAILED DESCRIPTION

Because of the relatively inexpensive cost of cast iron and its advantageous heat handling capabilities as well as its common usage in the manufacture of brake rotors, overcoming the wear and potential health issues (which are rapidly becoming a focal point of legislation in several U.S. states) associated with the use of cast-iron in braking system would be desirable. Additionally, wear of brake pad materials as well as rotors made of both cast iron and other materials can be problematic from the standpoint of vehicle maintenance costs and environmental impacts, among other concerns. To address these and potentially other challenges with existing technologies, one or more implementations of the current subject matter provide methods, systems, articles or manufacture, and the like that can, among other possible advantages, relate to brake systems including brake pads and brake rotors, methods of making brake pads and brake rotors, and other technological developments relating to improvements in braking technology.

A braking system that results in slower or even zero wear of either or both of a brake rotor and the brake pads is also desirable. Consistent with implementations of the current subject matter, a brake pad formed of a particular composition can be made with organic or otherwise less environmentally detrimental materials to eliminate the harmful or toxic materials of conventional brake pads. Brake pad materials consistent with implementations of the current subject matter can be also be formulated specifically to optimize operation with a brake rotor having a wear and corrosion resistant coating as discussed elsewhere herein.

As discussed in more detail below, a brake rotor can have surface roughness and hardness characteristics that maximize a useful lifetime of the brake rotor while also minimizing abrasive consumption of the friction material of a brake pad used in conjunction with the brake rotor. Implementations of the current subject matter further provide methods, systems, articles or manufacture, and the like, of a brake pad composition to optimize performance and minimize wear and release of harmful or toxic substances or matter.

Figure 1:
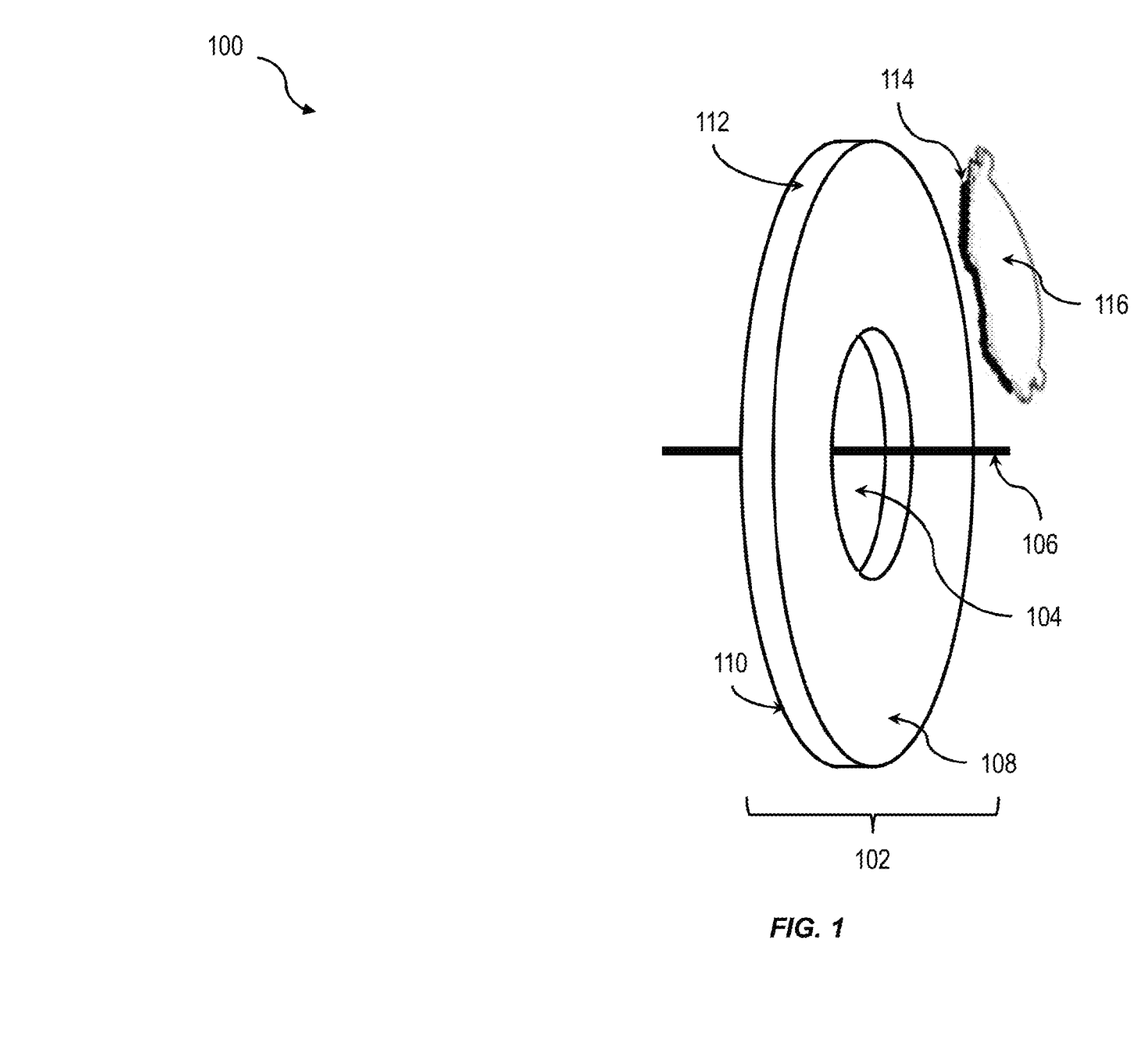
FIG. 1 is a perspective diagram illustrating features of a braking system.

FIG. 1 shows a diagram of an example braking system 100, in which a brake rotor 102 has a disk-shaped body with a central hole 104 adapted so that the brake rotor 102 can be positioned over the hub of a wheel (not shown) and centered on the axis of rotation 106 of the wheel and the brake rotor 102. The shape of the brake rotor 102 and the central hole 104 are shown in FIG. 1 as having a circular cross-section normal to the axis of rotation 106. However, this is merely an example. The cross-section of either or both of the brake rotor 102 and the central hole 104 can be non-circular as long as they are rotationally symmetrical about the axis of rotation 106. Opposing annular surfaces 108 and 110 are disposed on opposite sides of the brake rotor 102 and can optionally extend from the outer periphery 112 of the brake rotor 102 to the central hole 104. At least a portion of each of the annular surfaces 108 and 110 serves as a friction surface against which the friction material 114 of one or more brake pad(s) 116 is urged during braking. In some implementations of the current subject matter, the opposing annular surfaces can have one or more hollow volumes formed between them, for example by vanes, slots, a honeycombed structure, etc. to enhance cooling, reduce weight, and the like.

A wear and corrosion resistant coating can be applied to at least part of the friction surfaces on the two opposing annular surfaces 108 and 110 as described below as well as in one or more of co-pending and co-owned U.S. patent application publications 2008-0196985 A1, 2008/0196986A1, 2009/0050423A1, and 2009/0288921A1 and co-pending and co-owned U.S. patent application Ser. No. 12/848,429, the disclosures of which are hereby incorporated by reference in their entireties.

Figure 2:
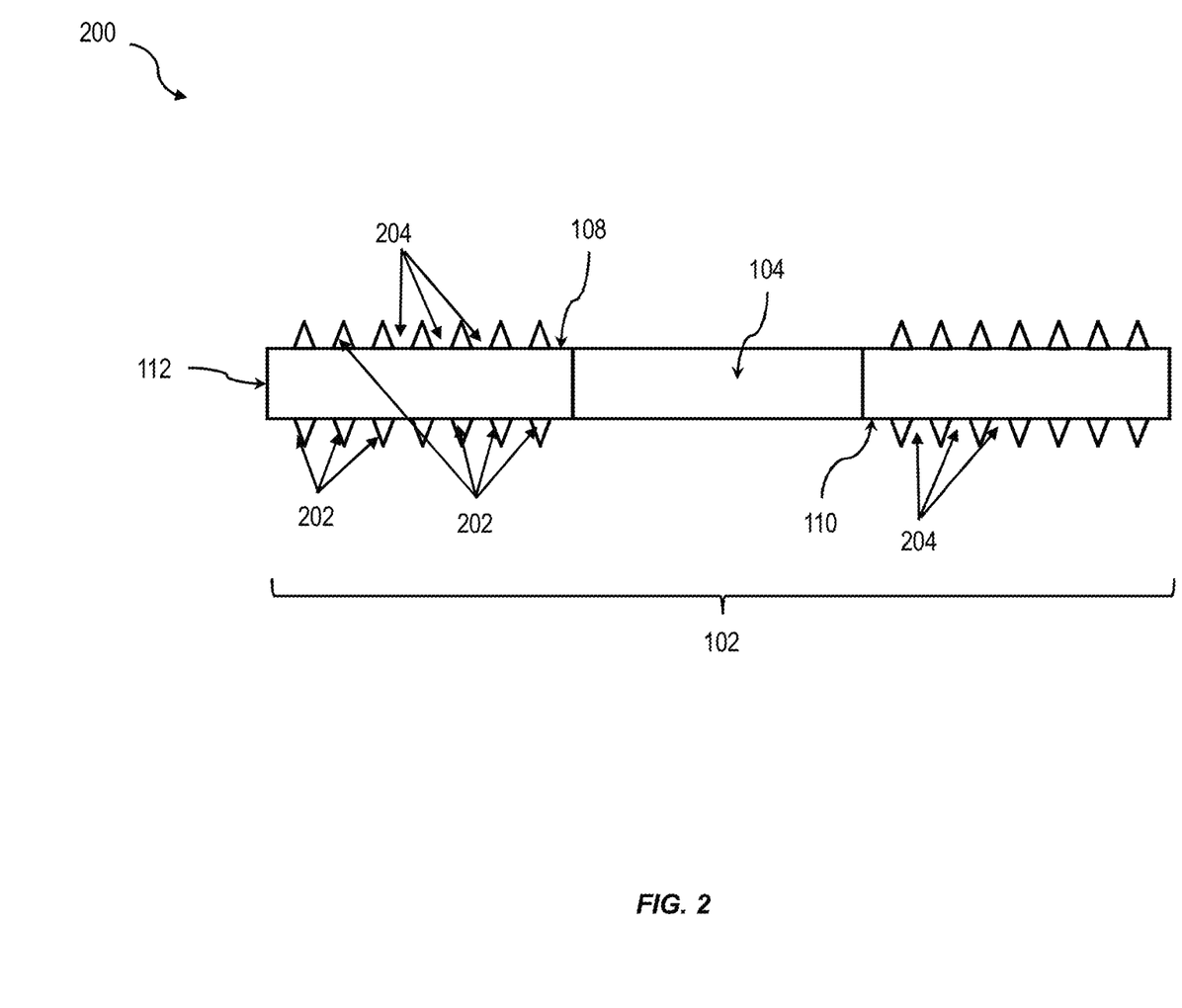
FIG. 2 shows a diagram illustrating a cross-sectional view of a brake rotor having surface roughness features.

As shown in the cross-sectional diagram 200 of a brake rotor 102 in FIG. 2, the friction surfaces disposed on the opposing annular surfaces 108 and 110 of the brake rotor 102 can in some implementations include surface roughness features that can take the form of a plurality of raised "peaks" 202 with spaced "valleys" 204 between (and around, etc.) the peaks. A uniform pattern can be used throughout the friction surface of an annular surface 108 or 110 of a brake rotor 102. Alternatively or in addition, a combination of different shaped surface features can be included to present a visible design or texture that can vary in a random or predetermined manner across either or both annular surfaces 108, 110.

The peaks 202 can have sharp, angular cross-sectional shapes as illustrated in FIG. 2. Other shapes of the peaks 202 and valleys 204 are also within the scope of this disclosure. Shapes of the peaks 202 can include, but are not limited to squares, trapezoids, rectangles, triangles, stars, letters or names, numbers, logos, trademarks, dashes, other geometric shapes, and the like, with or without rounded corners. The shape and positioning of the peaks 202 can be designed to be aesthetically pleasing in appearance, which is particularly desirable when the annular surfaces 108 and 110 are externally visible, as is the case with many motor cycle brake rotors and some automotive rotors used in conjunction with alloy wheels or the like. The valleys 204 adjacent to and/or surrounding the peaks 202 can result in a significant reduction in the overall weight of the brake rotor 102 which in turn can improve the efficiency and performance of the motor vehicle. Additionally, the valleys 204 can allow for air flow around the peaks 202 for increased cooling and heat dissipation. The base of each valley 204 can optionally be roughened or modulated to provide bumps or the like that create turbulence in air flow along the valley 204 which can also improve the cooling effect.

Peaks 202 of desired shapes and dimensions can be formed in any suitable manner, for example by appropriate machining or other forming processes. After forming peaks 202, valleys 204, and/or other surface roughness features on one or both annular surfaces 108, 110 of the brake rotor 102, the annular surface 108, 110 of the brake rotor 102 can be coated with a wear and corrosion resistant coating that eliminates or greatly reduces the rate at which the peaks 202 are worn down by contact with the friction material 114 of a brake pad. The wear and corrosion resistant coating can be deposited on the surfaces of the peaks 202 and also optionally in the valleys 204. The wear and corrosion resistant coating can improve the overall look or aesthetics of the brake rotor 102 while also substantially increasing its hardness relative to an uncoated brake rotor friction surface. Also, as discussed in more detail below, the peaks and valleys can also help establish and maintain or retain a uniform (e.g. even, consistent, thickness, etc.) transfer film layer on the friction surface of the brake rotor 102 which in turn supports adherent frictional properties that can improve braking performance of a baking system 100.

During braking action, some amount of the friction material 114 of a brake pad 116 is transferred to the friction surfaces of the brake rotor 102, thereby forming a transfer film. This transfer generally occurs during a "seating" or "break-in" process persisting for some period of time and/or miles driven after new brake pads 116 are installed on a vehicle. With a conventional brake rotor, even one initially manufactured with surface roughness features, the friction forces and stresses placed on the friction surfaces during normal braking operations typically rapidly lead to a flattening of the friction surface. Thus, any advantages that might have been gained from the surface roughness features (e.g. better cooling air flow, decorative patterns, retention of a transfer film of brake pad material, etc.) are highly transient and unlikely to be relevant for the majority of the useful lifetime of the brake rotor.

Figure 3:
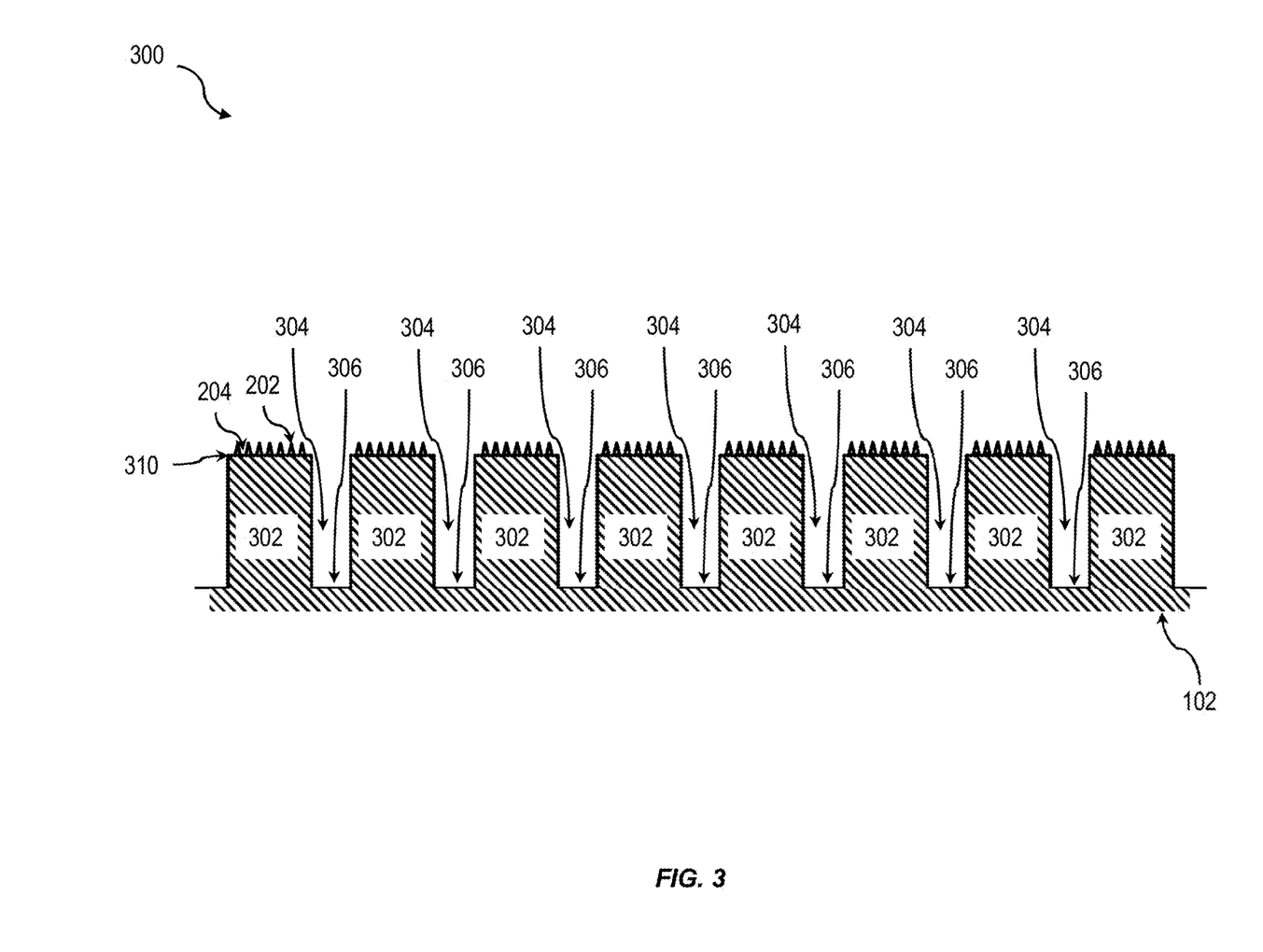
FIG. 3 shows a diagram illustrating a cross-sectional, magnified view of a brake rotor having two scales of surface topography.

In further implementations of the current subject matter, surface topography on a brake rotor surface 108, 110 can exist at two different scales as illustrated in the expanded diagram 300 of part of a brake rotor 102 shown in of FIG. 3. At a first, larger scale, multiple island formations 302 can be included on a friction surface. These multiple island formations can form a regular or irregular pattern in which islands are separated by channels 304, which can optionally have base surfaces 306 that are roughened. In one example, a representative distance from a top surface of the island formations to a base surface of channels formed between the island surfaces can be in a range of approximately 10 microns (0.0005 inches) to 3200 microns (0.125 inches). A ratio of the area (e.g. in a plane parallel to the annular surface 108, 110) occupied by the island formations to the area occupied by the channels 304 can optionally be in a range of one percent to ninety-nine percent or vice versa.

In some examples, at least part of the base surfaces 306 of the inter-island channels 304 can have a surface roughness sufficient to create turbulence to air masses flowing in a direction parallel to a plane defined by the annular surface (e.g. a surface orthogonal to an axis about which the brake rotor 102 rotates) for example as the brake rotor 102 rotates with a wheel of a motor vehicle. It will be understood that cross-sectional shapes of the island formations 302 can be substantially rectangular (e.g. as shown in FIG. 3) or any other regular or irregular shape. For example, the island formations can have substantially triangular, substantially trapezoidal, substantially circular, substantially curved, or any other regular or irregular cross-sectional shape as viewed in a plane perpendicular to an annular surface 108, 110 of a brake rotor 102. Various shapes of the island formations 302 as viewed in other planes are also within the scope of the current subject matter. For example, the island formations 302 can have substantially circular, substantially square, substantially rectangular, substantially tear drop shaped, substantially curved, or any other regular or irregular shape as viewed in a plane parallel to an annular surface 108, 110 of a brake rotor 102.

A second, smaller scale of surface topography on a brake rotor surface 108, 110 can include peaks 202 and valleys 204 similar to those described above in reference to FIG. 2. Such peaks and valleys or other "surface roughness" features can be created on upper surfaces 310 of the island formations 302.

Consistent with some implementations of the current subject matter, the first scale of surface topography can be advantageous in reducing an overall weight of a brake rotor 102 and can also provide cooling benefits by permitting an optionally turbulent flow of air along the base surfaces 306 of the channels 304 formed or defined between the island formations 302.

The second scale of surface topography can advantageously assist in retaining a transferred film or layer of brake pad material to surfaces of the brake rotor 102. In the example of FIG. 3, the upper surfaces 310 of the island formations 302 can form the friction surface of the brake rotor 102. The surface roughness at the second scale of surface topography (e.g. the peaks 202 and valleys 204) can act as an abrasive surface that effective scrapes some of the friction material 114 from the brake pad 116 and then retains this friction material in a transfer film layer on the friction surfaces of the brake rotor 102. This transfer film layer can be retained on the friction surface of the brake rotor 102 at least in part as a result of the second scale of surface topography, whose peaks 202 and valleys 204 can provide a structure that resists easy wiping off or other dislodging actions that might free the transfer film layer from a brake rotor 102 that lacks such features.

The transfer film layer can provide significant benefits in both durability and braking effectiveness of the braking system 100. For example, the retained transfer film layer of the friction material can protect the underlying material of the brake rotor 102 from abrasive friction interactions with the brake pad 116 and its friction material 114. Instead, the friction material 114 of the brake pad 116 can interact with similar material present in the transfer film layer retained on the brake rotor 102. The presence of similar materials on either side of the brake pad-brake rotor interaction during actuation of a braking system 100 can also provide improvements in braking power. In an example, the friction material 114 of the brake pad 116 and the transfer film layer on the brake rotor can experience a form of adherent friction, in which friction material dynamically transfers in either direction (e.g. back and forth between the brake pad 116 and the transfer film layer on the brake rotor 102), with a breaking and reforming of molecular bonds occurring as part of the process.

While adherent friction may occur to some small extent in previously available brake rotors, the absence of surface topography features (e.g. either or both of the peaks 202 and valleys 204 of the second scale of surface topography and optionally also the island formation 302 and channels 304 of the first scale of surface topography described herein) on the surfaces of conventional rotors can render this effect relatively insignificant. For example, the amount of transferred friction material present per unit area in a transfer film layer occurring on a conventional rotor can be orders of magnitude smaller than that present in a brake rotor 102 having features described herein. Additionally, without a surface topography structure capable of retaining a transfer film layer, the impact of adherent friction can be diminished as the transfer film layer would not be laterally anchored to the friction surface of the brake rotor 102 or otherwise resistant to rotational motion about the friction surface of the brake rotor 102 during actuation of the braking system except by relatively weak van der Waals or electrostatic forces. The first scale of surface topography (e.g. island formations 302 and channels 304) and/or the second scale of surface topography (e.g. peaks 202 and valleys 204) described herein, or functional or structural equivalents thereof, can provide a mechanical anchoring mechanism by which a transfer film layer has increased resistance to rotational forces and/or other forces or effects that might act to dislodge the transfer film layer from the friction surface when the braking system 100 is actuated.

Other potential advantages can result for a brake rotor 102 having one or more scales of surface topography as described herein that are sufficient to generate and retain a transfer film layer that includes friction material from a brake pad 116 acting on the brake rotor 102. For example, the transfer film layer can act as a protective layer that reduces abrasive friction on the friction surface of the brake rotor 102. This protective feature can be beneficial in extending the useful lifetime of a brake rotor 102 as overall wear of the friction surface can be reduced. Adherent friction and/or one or more other mechanisms that improve braking effectiveness of a braking system the includes such a brake rotor 102 and a brake pad 116 with creation of a transfer film layer can also reduce wear of the friction material from the brake pad 116. This effect may also result from the increased importance of adherent friction relative to abrasive friction as well as the possibility that a "stickier" brake rotor 102 to brake pad friction material interaction can require less overall force to be applied during actuation of the braking system. Decreased wear of the friction material of a brake pad 116 can reduce an amount of friction material debris created during actuation of the braking system 100 and released into the environment. As one or more chemical components of brake pad friction material can be damaging to the environment, human health, etc., this effect can has significant advantages, particularly in view of increasing governmental regulation of emission from braking systems.

Each of a first scale of surface topography and a second scale of surface topography on a friction surface of a brake rotor 102 can be created, formed, etc. through one or more processes. For example, a surface finishing process for creating the island formations 302 and channels 304 of a first scale of surface topography can include one or more machining or forming techniques, including but not limited to bead blasting, grinding, acid etching, laser etching, roll forming, embossing, stamping, honing, lapped, polished, blanched, milled, profiled or any other machined surface treatment or surface geometry modification and any combination(s) thereof. A surface finishing process for creating peaks 202 and valleys 204 of a second scale of surface topography can include one or more machining or forming techniques, including but not limited to bead blasting, sanding, grinding, acid etching, photo-resist etching, roll forming, embossing, stamping, honing, lapping, polishing, blanching, milling, profiling, or any other machined surface treatment or surface geometry modification and any combination(s) thereof.

Consistent with implementations of the current subject matter, durability can be imparted to some or all of the area of the annular surfaces 108, 110 of a brake rotor by the addition of a wear and corrosion resistant coating. In general, one or more surface finishing processes for creating either or both of a first scale of surface topography and a second scale of surface topography can advantageously occur prior to the processes discussed herein for applying or otherwise creating the wear and corrosion resistant coating A wear and corrosion resistant coating, either one that is consistent with the examples described herein or one formed using other approaches, can cause surface topography features of a friction surface of a brake rotor 102 to be persistent and durable, even after prolonged use of the brake rotor 102 (e.g. in operation of a motor vehicle or the like). Spacing of the peaks 202 and valleys that are formed in such a surface configuration can be regular or irregular. The peak and valley configuration can operate during braking to transfer some of the material of a brake pad to the brake rotor such that subsequent braking can be enhanced due to adherent friction between the similar brake pad material on the pad itself and on the rotor surface, as discussed in more detail below.

In implementations of the current subject matter, a brake rotor substrate formed of cast iron or some other bulk material having desirable bulk characteristics (e.g. sufficient rigidity, desirable weight properties, cost, etc.) can be prepared with a wear and corrosion resistant coating. Such a rotor can be cleaned; for example to remove impurities such as oil, grease, dirt, oxides, and the like.

The cleaned brake rotor substrate can then be pre-treated using a back-sputtering process performed under a controlled atmosphere (e.g. a vacuum, a partial vacuum, an inert atmosphere such as nitrogen or argon or the like, etc.). A back-sputtering process can include generating ions, which are accelerated toward a surface of the brake rotor substrate by a biasing voltage. In some examples, the biasing voltage can be in a range of approximately 400 to 1200 V or alternatively in a range of about 600 to 1000 V, and the back-sputtering process can be applied for a duration of about 3 to 20 minutes or for other durations depending on one or more of physical properties of the rotor, desired surface characteristics, chemical properties of the rotor substrate material, etc. The pre-treatment process can further clean the surface of the brake rotor substrate in addition to activating the surface to enhance its receptivity to subsequent physical vapor deposition processes.

One or more supporting layers of a preparatory metal can be deposited onto surfaces of the pre-treated brake rotor substrate. The one or more supporting layers can act as a support for a wear and corrosion resistant outer coating applied to the brake rotor substrate consistent with the current subject matter. As used herein, a preparatory metal can include one or more of chrome, nickel, or other similar materials. The preparatory layer can be formed to meet a variety of functional or decorative purposes, such as for example enhanced environmental corrosion protection, galvanic corrosion protection (or perhaps to accelerate corrosion of a sacrificial material or the like), regenerative braking, electro-magnetic braking, sensing, radio frequency identification (RFID), serving as decorative base layer for photo-chemical etching, or the like. In optional variations, the material of a supporting layer can be applied using a wet plating process, plasma spraying, or any other methods capable of applying one or more metallic coatings with a thickness in a range between a fraction of a micron to several thousand microns thick. In an advantageous implementation, the one or more supporting layers of the preparatory metal can be applied using one or more of a physical vapor deposition process, a sputtering process, an evaporative or cathodic arc process, or the like.

Figure 4A:
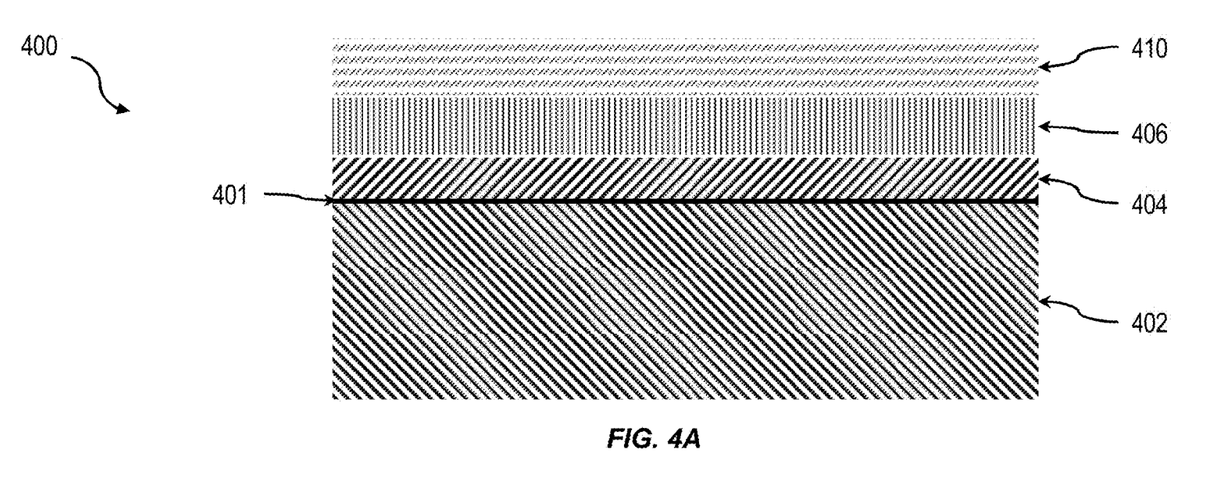
FIG. 4A and FIG. 4B show diagrams illustrating cross-sectional, magnified views of a brake rotor coated in a manner consistent with one or more implementations of the current subject matter, with FIG. 4A showing discrete layers and FIG. 4B showing at least partial integration of the components of separate layers to form a combined layer.

FIG. 4A shows a side cross-sectional view illustrating features of a brake rotor 400 consistent with implementations of the current subject matter. A shown in FIG. 4A, an outer surface 401 of a brake rotor substrate 402 has a supporting layer 404 applied to it. Subsequent to the coating of the rotor surface with the supporting layer 404, a wear and corrosion resistant coating, which can include a first layer 406 of a first layer material and a second layer 410 of a second layer material, can be applied over the supporting layer 404. In various implementations, the first layer material includes a metal, such as for example pure titanium metal or other metals (e.g. chromium, zirconium, aluminum, hafnium, etc.) and the second layer material includes a nitride, boride, carbide or oxide of the first layer material. Either or both of the first layer 406 and the second layer 410 can be applied using a method such as physical vapor deposition, sputtering, or the like after the supporting layer 404 is in place. Each of the first layer and the second layer can also be repeated, either alternatively (e.g. in a first layer, second layer, first layer, second layer sequence) or to build a larger amount of the first layer material followed by a larger amount of the second layer material (e.g. in a first layer, first layer, first layer, second layer, second layer, second layer sequence). In some implementations of the current subject matter as discussed below, one or more layers of graphene can be included, either as an additional layer or in some examples as a replacement for the first material and/or second material.

Figure 4B:
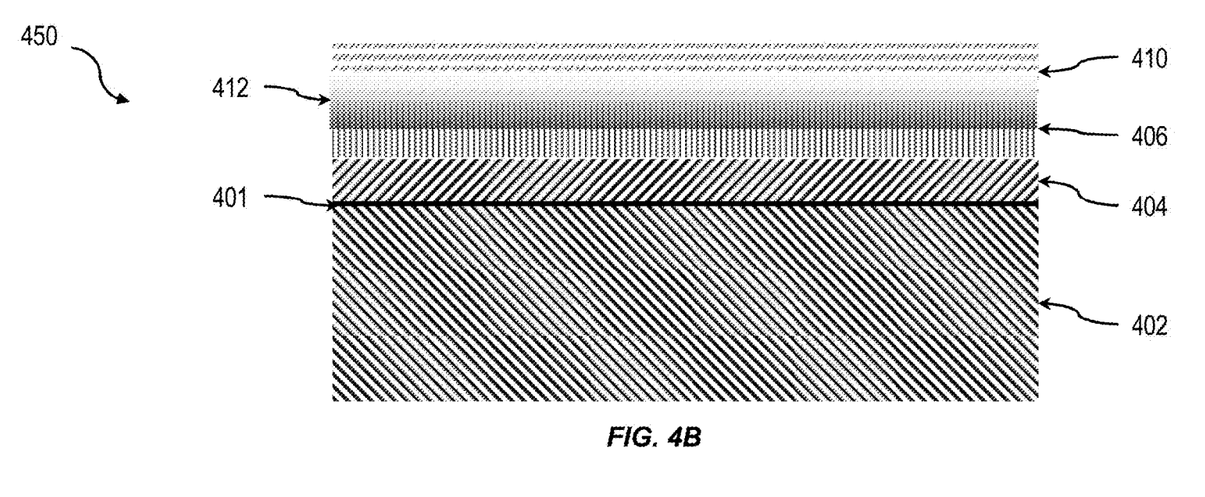

FIG. 4B shows a side cross-sectional view illustrating features of a brake rotor 450 consistent with implementations of the current subject matter. As shown in FIG. 4B (and similar to the example of FIG. 4A, the outer surface 401 of a brake rotor substrate 402 has a supporting layer 404 applied to it. Subsequent to the coating of the rotor surface with the supporting, layer 404, a wear and corrosion resistant coating, which can include a first layer 406 of a first layer material and a second layer 410 of a second layer material, can be applied over the supporting layer 404. FIG. 4B further illustrates that the deposited layers need not be homogeneous and discrete. Instead, in one example, a first layer 406 of the first material can be at least partially integrated with a second layer 410 of the second material to form a layer 412 combining elements from each of the two layers.

A combination of the cleaning and pre-treating of the brake rotor substrate, in addition to application of a supporting layer 104, can provide a suitable substrate for subsequent deposition of one or more iterations of the first layer 106 and second layer 110 of the wear and corrosion resistant coating as discussed elsewhere herein.

The first layer 106 can include an amorphous (non-crystalline) structure or a crystalline structure. The first layer 106 can include multiple layers or multiple layers that can be merged to form a single layer. The thickness of each layer of the first layer 106 can vary from one or a few atoms in depth to thousands of Angstroms. The surface irregularity or defect can be variations in the height of the parallel surfaces and angled surfaces between the variations in height illustrated in FIG. 3B. In addition, the surface irregularity or modification can be formed as peaks, valleys and angular surfaces between the peaks and valleys. When the oppositely disposed surfaces of the brake rotor are subsequently coated with a the supporting layer and the wear and corrosion resistant coating, the coated surfaces can continue to exhibit a three dimensional appearance or surface texture. Furthermore, the surface texturing of the surfaces of the brake rotor are durable and wear resistant such that the three dimensional appearance or surface texture persistent, even after extended use of the brake rotor in a vehicle braking system The wear and corrosion resistant coating can also include a second layer 110 that overlays and contacts the first layer 106. Though the first and second layers 106, 110 and the supporting, layer are depicted as distinct, in some implementations of the current subject matter, the layers intermingle or merge such that no distinct boundary exists between the layers. The second layer material can include one or more binary metals, for example, one or more metal nitrides, metal borides, metal carbides and metal oxides. The second layer material can include one or more nitrides, borides, carbides or oxides of the metal used in the first layer. In some examples, amorphous titanium can form some or all of the first layer 106 and a titanium nitride (TiN, $Ti_2N$, etc.) can form all or some of the second layer 110. The multiple layers, for example the first and second layers 106, 110, optionally repeated one or more times, can be configured to form a lattice structure or a super lattice structure, which can include thin films formed by alternately depositing two different components to form layered structures. Multilayers become super-lattices when the period of the different layers is less than 100 angstroms. With this cooperation of structure, a coating having a service life to exceed approximately 100,000 vehicle miles or more can be obtained. It should be noted that chemical abbreviations (e.g. TiN, $Ti_2N$, etc.) are used herein as a shorthand rather than an exact chemical label, and do not suggest that the stoichiometry of the indicated compound must be exactly as stated in the abbreviation.

The wear and corrosion resistant coating can cause surface roughness features on the annular surfaces 108, 110 of the brake rotor 102 to be significantly more durable to wear from normal braking activities. As such, the peak 202 and valley 204 topography that is originally present on the friction surfaces of the brake rotor 102 can persist for a large percentage of the useful life of the brake rotor 102, which can in some implementations be many multiples of a typical useful lifetime for a conventional brake rotor without a wear and corrosion resistant coating as described herein.

Surface roughness features on the friction surface of a brake rotor 102 can interact during application of the friction material 114 of the brake pad 116 to the friction surface during braking system operation to cause the surface roughness features of the friction surface to accumulate a layer of transferred friction material 114 from the brake pad 116 to the friction surface. This accumulated layer of friction material on the brake rotor 102 friction surface can experience enhanced friction properties via an adherent friction interaction with the friction material 114 remaining on the brake pad 116. For example, adhesion between the friction material 114 remaining on the brake pad 116 and that transferred to the brake rotor 102 can be more pronounced than adhesion between the friction material 114 on the brake pad 116 and a clean surface of the brake rotor 102. The accumulated layer of friction material transferred to the friction surface of the brake rotor 102 can be successively refreshed by transfer of additional amounts of friction material 114 from the brake pad 116 to the brake rotor 102. The accumulated layer can also serve to protect the underlying surface roughness features on the friction surface of the brake rotor 102 from excessive wear. The adherent friction interaction between friction material 114 remaining on the brake pad 116 and friction material transferred to the friction surface(s) of the brake rotor 102 can enhance the normal abrasive fiction interaction between the friction material 114 of the brake pad and the uncoated friction surface of the brake rotor 102.

The hardness of the coating on the friction surfaces of a brake rotor can dictate how persistent the surface roughness condition of the friction surfaces is over repeated braking events. A typical, uncoated brake rotor constructed of cast iron, stainless steel, light weight metal alloys, ceramic materials, ceramic composite materials, titanium, etc. and/or combinations thereof generally has a hardness as measured on the Rockwell "C" scale of about 35±4. The surface roughness features of the friction surfaces of a brake rotor 102 according to implementations of the current subject matter can be characterized by an average amplitude between the peaks 202 and valleys 204 of the second scale of surface topography, which can in some implementations be in a range of approximately 0.6 μm to 0.85 μm (approximately 26-32 micro-inches). In addition to improved durability resulting from increased hardness of the friction surface of a brake rotor, in some implementations of the current subject matter, a coating imparting wear and corrosion resistance consistent the descriptions herein can also provide a type of solid lubrication. For example, inclusion of chromium and/or possibly other metals can cause the friction surface to be have increased hardness as well as increased "slipperiness," which can counteract the wear effects of abrasive friction occurring between a friction material of a brake pad 116 and the friction surface of the brake rotor 102.

According to implementations of the current subject matter, an optimized relationship between the surface roughness and the surface hardness can be obtained to maximize persistence of the peak 202 and valley 204 surface roughness features over a useful lifetime of a brake rotor 102. The optimal relationship between the surface roughness and surface hardness is one at which the peak and valley topography is maintained to allow continued transfer and retention of friction material from a brake pad 116 to a friction surface of the brake rotor 102 such that adherent friction between the transferred friction material and the friction material 114 remaining on the brake pad 116 adds to abrasive friction forces between the brake rotor itself and the friction material 114 of the brake pad to improve the stopping power of a braking system 100.

Excessive hardness may lead to brittleness, while too little hardness may lead to premature wear of the surface roughness features. Also, excessive surface roughness may lead to too rapid a consumption of the friction material 114 on a brake pad 116 as too much of the friction material is transferred to and potentially scaled away from the friction surface of the brake rotor. Too little surface roughness on the brake rotor 102 may lead to too little transfer of friction material and/or too little retention of the transferred friction material on the friction surfaces of the brake rotor 102, thereby weakening the braking power and potentially requiring greater reliance on abrasive friction, which can lead to increased wear.

In further implementations, and with reference to FIG. 1 the friction material 114 of one or more brake pad(s) 116 can be formulated to optimize braking performance of the braking system, by optimizing cooperation with the wear and corrosion resistant coated rotors 102 described herein. Such cooperation maximizes braking performance (i.e., lowers braking distance and time, improves surface-to-surface contact, etc.) while minimizing wear and release of harmful or toxic materials into the atmosphere or environment. Table 1 represents a formation of a friction material 114 for a brake pad in accordance with advantageous implementations.

TABLE 1

Example fractions of components of brake pad material formulations consistent with implementations of the current subject matter.

|    | Constituent    | Formula 1 | Formula 2 |
|----|----------------|-----------|-----------|
| 1  | Fe powder      | 60        | 59        |
| 2  | steel chip     | 7         | 8         |
| 3  | SiC            | 1         | 2         |
| 4  | Ba(SO)4        | 5         | 6         |
| 5  | Iron Sulfide   | 2.5       | 0         |
| 6  | coke           | 9         | 9         |
| 7  | rubber         | 4         | 4         |
| 8  | phenolic resin | 7         | 7         |
| 9  | MgO            | 2         | 1         |
| 10 | sulfur         | 2.5       | 4         |
|    | TOTAL          | 100       | 100       |

The formulations in Table 1 represent an approximate percentage, either by weight, mass, or volume, or a combination thereof. Further, the approximate value for each component material in each formula can vary in some implementations by +/−5%, or +/−10% or more. For example, the percentage of the formula for each component can vary in alternative formulas by +/−50% or more. In some implementations of the current subject matter, a brake pad friction material can advantageously include primarily environmentally inert components. For example, and/or one or more other toxic or otherwise undesirable friction material components can be excluded from the friction material. In other implementations of the current subject matter, one or more beneficial components can be included in the composition of a brake pad friction material, such as for example a material that acts as a fertilizer when deposited on the land surface.

An additional variable in the analysis of an optimal surface roughness and surface hardness regime can be the composition and other physical properties of the friction material of a brake pad. For example, a brake pad with a friction material that is readily transferrable and/or adherable to a friction surface of a brake rotor may require a less pronounced surface roughness to create the advantages disclosed herein for the inventive subject matter. In such an example, a relatively lower surface roughness may be used in conjunction with an increased surface hardness as the lower amplitude between the peaks 202 and valleys 204 of the surface topography of the brake rotor 102 can be less prone to damage due to the increased brittleness that can accompany increased surface hardness.

Figure 5:
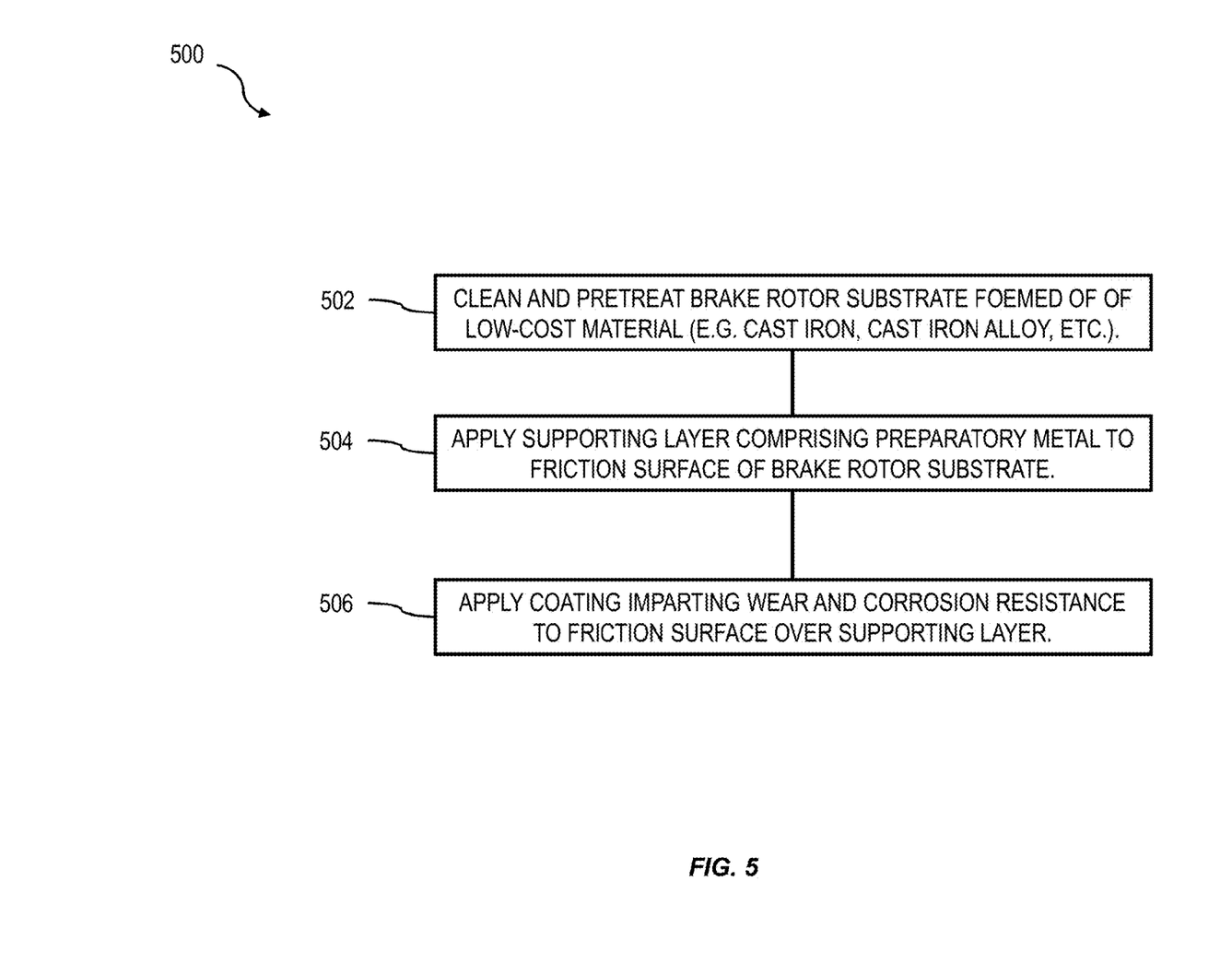
FIG. 5 is a process flow diagram illustrating aspects of a method having one or more features consistent with implementations of the current subject matter.

FIG. 5 shows a process flow chart illustrating features of a method consistent with implementations of the current subject matter. A brake rotor substrate, which can advantageously be a brake rotor formed of a low cost material, can be cleaned and pretreated at 502. The pre-treating can include a back-sputtering process under a reduced reactivity atmosphere (e.g. an inert gas atmosphere, an at least partial vacuum, etc.).

At 504, a supporting layer is applied to the pretreated surface. The supporting layer can include a metal such as nickel or chromium, and can be applied through one or more techniques, such as for example wet plating, plasma spraying, physical vapor deposition, sputtering, evaporative arc or cathodic arc in a controlled atmosphere, etc. At 506, a wear and corrosion resistant coating can be applied subsequent to application to the rotor surface. The wear and corrosion resistant coating can advantageously include at least a first layer and a second layer, which can respectively include a metal (e.g titanium or other metals) in an amorphous or crystalline form and a binary metal as discussed above.

In alternative implementations of the current subject matter, the coating can include graphene, which is a 2-dimensional, crystalline allotrope of carbon in which carbon atoms are densely packed in a regular $sp^2$-bonded atomic scale "chicken wire" (e.g. hexagonal) structure. Graphene can be described as a one-atom thick layer of graphite. It is the basic structural element of other allotropes, including graphite, charcoal, carbon nanotubes, and fullerenes. It can also be considered as an indefinitely large aromatic molecule, the limiting case of the family of flat polycyclic aromatic hydrocarbons. High-quality graphene is strong, light, nearly transparent and an excellent conductor of heat and electricity. Its interactions with other materials and with light and its inherently two-dimensional nature produce unique properties, such as the bipolar transistor effect, ballistic transport of charges, and large quantum oscillations. Addition of graphene to a brake rotor 102 consistent with implementations of the current subject matter can provide one or more potential advantages, potentially including but not limited to improved durability, cooling, corrosion resistance, or the like.

In some implementations of the current subject matter, the method illustrated in the process flow chart 500 of FIG. 5 can include an additional surface finishing process, which can add a surface topography feature to a friction surface of the brake rotor substrate prior to application of the wear and corrosion resistant coating at 506. The surface topography feature can optionally include either or both of the first scale of surface topography and the second scale of surface topography as discussed herein. The additional surface finishing process can optionally occur prior to the application of the supporting layer at 504 and optionally prior to the cleaning and pretreating at 502.

Figure 6:
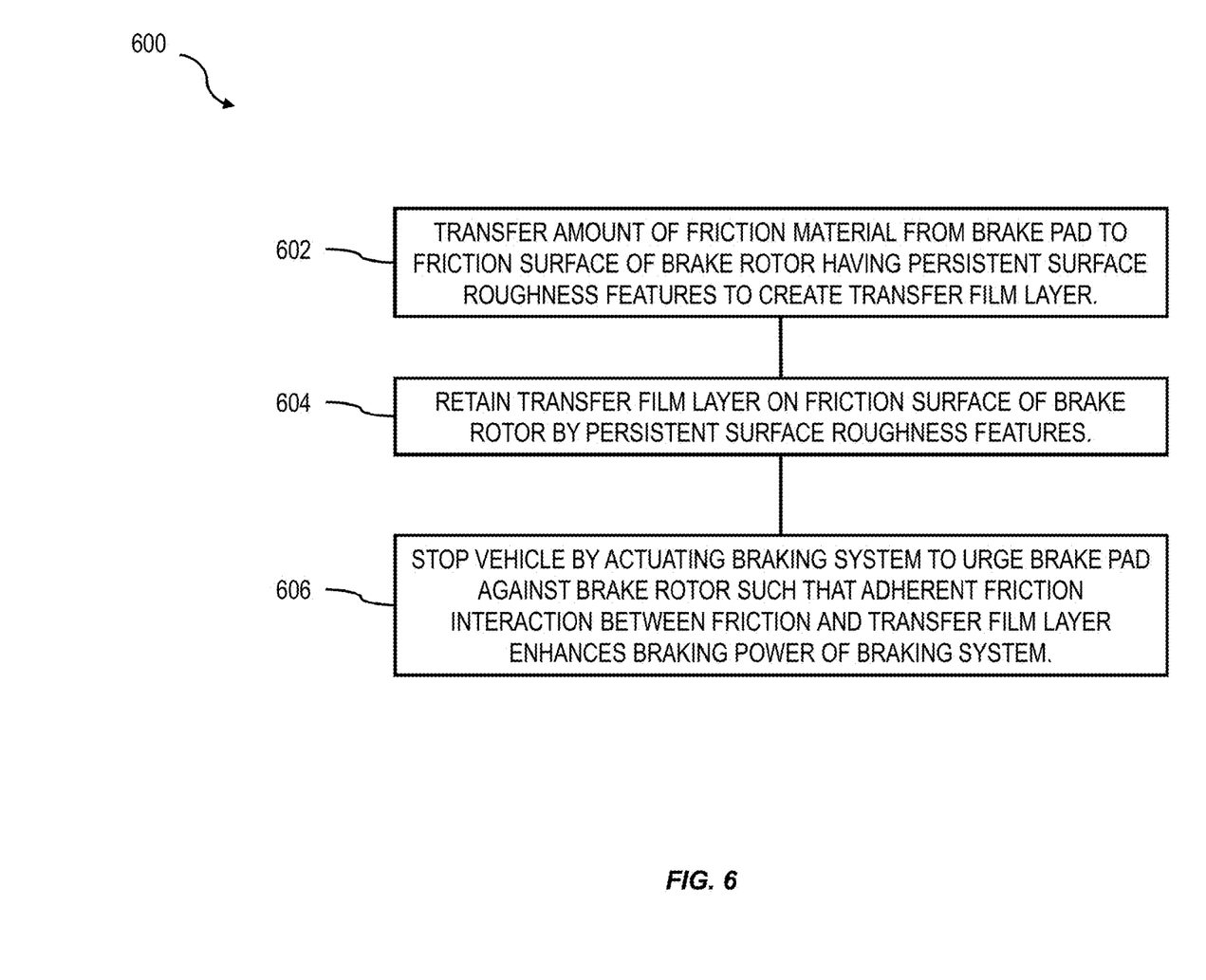
FIG. 6 is a process flow diagram illustrating aspects of a method having one or more features consistent with implementations of the current subject matter.

In related implementations of the current subject matter, a method as illustrated in the process flow chart 600 of FIG. 6 can include transferring an amount of a friction material from a brake pad to a friction surface of a brake rotor at 602. The friction surface of the brake rotor has persistent surface roughness features, which can optionally include a first scale of surface topography and/or a second scale of surface topography as discussed elsewhere herein. The transferring of the friction material to the friction surface creates a transfer film layer on the friction surface.

At 604, the transfer film layer is retained on the friction surface at least in part due to the persistent surface roughness features. For example, as discussed above, the surface roughness features of the first scale of surface topography and/or the second scale of surface topography on the friction surface can provide a mechanical anchoring effect that holds the transfer film layer in place. The surface roughness features of the first scale of surface topography and/or the second scale of surface topography can be considered persistent if they are not appreciably worn down due to use of the brake rotor in braking. In some examples, the surface roughness features can be made persistent due to application of one or more coatings that impart wear and corrosion resistance to the friction surface of the brake rotor.

At 606, the method includes stopping a vehicle, for example by actuating a braking system that includes the brake pad and the brake rotor. The actuating causes the friction material of the brake pad to be urged into contact with the transfer film layer on the friction surface of the brake rotor such that an adherent friction interaction between the friction material and the transfer film layer enhances a braking power of the braking system. As used herein, the term enhanced can reflect an improvement over braking performance of a comparably sized brake rotor and similar brake pad material. This improvement can result in a stopping distance improvement of at least 5%, and in some cases of more than 10%, 15%, 20%, 25%, 30%, or 35% or more relative to a comparably sized brake rotor operating in a same braking system on a same vehicle. References to a stopping distance refer to any type of braking test, for example those that involve applying a braking system of a vehicle traveling at a first speed to determine a minimum distance the vehicle would travel under full braking force while slowing from the first speed to a second speed. In some cases, the second speed is a complete stop. A stopping distance improvement can be measured as a relative reduction in this stopping distance using a braking system that includes one or more of the features discussed herein relative to a conventional braking system. For a relevant comparison, a conventional rotor (e.g. one lacking persistent surface roughness features that can assist in retaining a transfer film layer of the brake pad friction material on the friction surface of the brake rotor) would have the same size as a brake rotor consistent with the current subject matter.

The implementations set forth in the foregoing description do not represent all implementations consistent with the subject matter described herein. Instead, they are merely some examples consistent with aspects related to the described subject matter. Although a few variations have been described in detail herein, other modifications or additions are possible. In particular, further features and/or variations can be provided in addition to those set forth herein. For example, the implementations described above can be directed to various combinations and sub-combinations of the disclosed features and/or combinations and sub-combinations of one or more features further to those disclosed herein. In addition, the logic flows depicted in the accompanying figures and/or described herein do not necessarily require the particular order shown, or sequential order, to achieve desirable results.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together."

Use of the term "based on," above and in the claims is intended to mean, "based at least in part on," such that an unrecited feature or element is also permissible.

Other implementations may be within the scope of the following claims.

What is claimed is:

1. A brake rotor, comprising
a supporting layer applied to a friction surface of a brake rotor substrate, the supporting layer comprising a preparatory metal; and
a coating applied over the supporting layer, the coating imparting wear and corrosion resistant properties to the friction surface
wherein the friction surface of the brake rotor substrate comprises an activated layer, the activated layer resulting from back-sputtering of the friction surface prior to the supporting layer having been applied.

2. A brake rotor as in claim 1, wherein the brake rotor substrate comprises at least one of cast iron and an alloy of cast iron.

3. A brake rotor as in claim 1, wherein the back-sputtering of the friction surface comprises accelerating ions of the preparatory metal at the friction surface under a voltage in a range of approximately 400 V to 1200 V.

4. A brake rotor as in claim 1, wherein the preparatory metal comprises at least one of chrome and nickel.

5. A brake rotor as in claim 1, wherein the coating comprises graphene.

6. A brake rotor as in claim 1, wherein the coating comprises a first layer comprising a first material and a second layer comprising a second material.

7. A brake rotor as in claim 6, wherein the first material comprises a metal.

8. A brake rotor as in claim 7, wherein the metal comprises at least one of titanium, chromium, zirconium, aluminum, and hafnium.

9. A brake rotor as in claim 6, wherein the first layer comprises a plurality of layers of the first material merged to form a single layer.

10. A brake rotor as in claim 6, wherein the second material comprises at least one of a nitride, a boride, a carbide, or an oxide of the first material.

11. A brake rotor as in claim 6, wherein the coating comprises multiple iterations of the first layer and the second layer.

12. A brake rotor as in claim 11, wherein the multiple iterations of the first layer are deposited sequentially prior to deposition of the multiple iterations of the second layer.

13. A brake rotor as in claim 11, wherein the multiple iterations of the first layer are deposited alternatively with intervening deposition of one or more of the multiple iterations of the second layer.

14. The brake rotor as in claim 11, wherein each of the multiple iterations of the first layer and each of the multiple iterations of the second layer have a thickness in a range of one atom to three or four thousand Angstroms.

15. A brake rotor as in claim 1, wherein the friction surface comprises a first scale of surface topography, the first scale of surface topography comprising a plurality of island formations separated by channels.

16. A brake rotor as in claim 15, wherein some of a friction material of a brake pad is transferred to the friction surface of the brake rotor during braking such that a transfer film layer comprising the transferred friction material is created and mechanically held in place on the friction surface of the brake rotor by features of the first and/or second scale of surface topography.

17. A brake rotor as in claim 16, wherein the friction material of the brake pad and the friction material of the transfer film layer participate in an adherent friction interaction that enhances a braking power of a braking system comprising the brake rotor and the brake pad.

18. A brake rotor as in claim 16, wherein a friction material of the brake pad consists essentially of components other than copper.

19. A brake rotor as in claim 1, wherein the friction surface comprises a second scale of surface topography, the second scale of surface topography comprising a plurality of peaks and valleys of regular or irregular shape.

* * * * *